United States Patent
Sugo et al.

(10) Patent No.: US 9,934,996 B2
(45) Date of Patent: Apr. 3, 2018

(54) WAFER PROCESSING BONDING ARRANGEMENT, WAFER LAMINATE, AND THIN WAFER MANUFACTURING METHOD

(71) Applicant: SHIN-ETSU CHEMICAL CO., LTD., Tokyo (JP)

(72) Inventors: Michihiro Sugo, Annaka (JP); Hiroyuki Yasuda, Annaka (JP); Shohei Tagami, Annaka (JP); Masahito Tanabe, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/232,175

(22) Filed: Aug. 9, 2016

(65) Prior Publication Data

US 2017/0053821 A1    Feb. 23, 2017

(30) Foreign Application Priority Data

Aug. 18, 2015  (JP) .................................. 2015-160812

(51) Int. Cl.
*H01L 21/683* (2006.01)
*C09J 183/00* (2006.01)
(Continued)

(52) U.S. Cl.
CPC ............ *H01L 21/6835* (2013.01); *B32B 7/12* (2013.01); *B32B 27/06* (2013.01); *C09J 183/00* (2013.01);
(Continued)

(58) Field of Classification Search
CPC ............... H01L 21/6835; H01L 21/304; H01L 2221/68318; H01L 2221/68381;
(Continued)

(56) References Cited

U.S. PATENT DOCUMENTS 7,541,264 B2  6/2009  Gardner et al.
8,800,631 B2  8/2014  Noda et al.
(Continued)

FOREIGN PATENT DOCUMENTS

EP    1550156 A2    7/2005
EP    2 657 963 A2   10/2013
(Continued)

OTHER PUBLICATIONS

European Search Report dated Dec. 12, 2016, issued in counterpart European Patent Application No. 16182486.7. (13 pages).

*Primary Examiner* — Jay C Chang
*Assistant Examiner* — Charles R Peters
(74) *Attorney, Agent, or Firm* — Westerman, Hattori, Daniels & Adrian, LLP

(57) ABSTRACT

A bonding arrangement comprising a silicone-base adhesive composition is suited for temporarily bonding a wafer to a support for wafer processing. The bonding arrangement includes a first temporary bond layer of non-silicone thermoplastic resin, and a second temporary bond layer of thermosetting silicone polymer and/or a third temporary bond layer of thermosetting siloxane-modified polymer. The second and/or third bond layer contains an antistatic agent.

12 Claims, 1 Drawing Sheet

(51) Int. Cl.
  *B32B 7/12* (2006.01)
  *B32B 27/06* (2006.01)
  *H01L 21/304* (2006.01)
  *H05F 1/00* (2006.01)
(52) U.S. Cl.
  CPC ............. *H01L 21/304* (2013.01); *H05F 1/00* (2013.01); *B32B 2457/14* (2013.01); *H01L 2221/6834* (2013.01); *H01L 2221/68318* (2013.01); *H01L 2221/68327* (2013.01); *H01L 2221/68381* (2013.01); *H01L 2221/68386* (2013.01)
(58) Field of Classification Search
  CPC ... H01L 2221/6834; H01L 2221/68327; H01L 2221/68386; H05F 1/00; C09J 183/00; B32B 7/12; B32B 27/06; B32B 2457/14
  See application file for complete search history.

(56) References Cited

U.S. PATENT DOCUMENTS

| 2011/0136321 | A1 | 6/2011 | Kuroda et al. |
| 2012/0175045 | A1 | 7/2012 | Furuya et al. |
| 2012/0276717 | A1 | 11/2012 | Furuya et al. |
| 2013/0280886 | A1* | 10/2013 | Kato ........................ B32B 7/06 438/459 |
| 2014/0154868 | A1 | 6/2014 | Sugo et al. |
| 2014/0162434 | A1 | 6/2014 | Shiga et al. |
| 2016/0272849 | A1* | 9/2016 | Fujiwara ................ C09J 129/04 |
| 2016/0326414 | A1* | 11/2016 | Tagami ............... H01L 21/6835 |

FOREIGN PATENT DOCUMENTS

| EP | 3 037 495 A1 | 6/2016 |
| EP | 3 038 148 A1 | 6/2016 |
| JP | 2004-64040 A | 2/2004 |
| JP | 2006-328104 A | 12/2006 |
| JP | 2014-141649 A | 8/2014 |
| JP | 2015-41663 A | 3/2015 |
| WO | 2015/025661 A1 | 2/2015 |
| WO | 2015/072418 A1 | 5/2015 |
| WO | 2015/115060 A1 | 6/2015 |
| WO | WO2015/115060 A1 * | 8/2015 ........... H01L 21/683 |

* cited by examiner

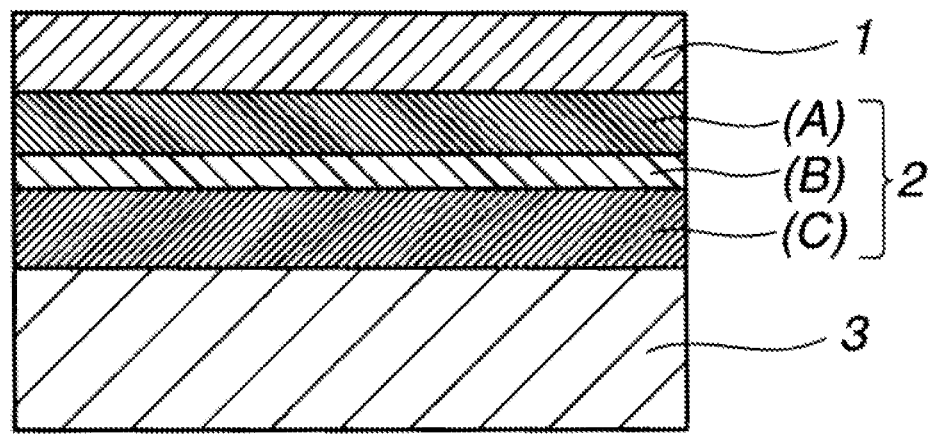

US 9,934,996 B2

WAFER PROCESSING BONDING ARRANGEMENT, WAFER LAMINATE, AND THIN WAFER MANUFACTURING METHOD

CROSS-REFERENCE TO RELATED APPLICATION

This non-provisional application claims priority under 35 U.S.C. § 119(a) on Patent Application No. 2015-160812 filed in Japan on Aug. 18, 2015, the entire contents of which are hereby incorporated by reference.

TECHNICAL FIELD

This invention relates to a bonding arrangement capable of manufacturing a thin wafer while restraining particle generation, a wafer laminate, and a method for manufacturing a thin wafer.

BACKGROUND ART

Three-dimensional semiconductor packages become essential for a higher density and capacity. The 3D semiconductor packaging technology is by thinning semiconductor chips, and stacking them in multilayer structure while providing through-silicon via (TSV) interconnects. Fabrication of such packages requires the steps of thinning a substrate having a semiconductor circuit formed therein by grinding its non-circuit forming surface or back surface, and forming TSV and electrodes on the back surface. In the prior art, prior to the step of grinding the back surface of a silicon substrate, a protective tape is attached to the surface of the substrate opposite to the surface to be ground for preventing the wafer from breakage during the grinding step. Since the protective tape is based on an organic resin film, it is flexible, but has insufficient strength and heat resistance to withstand the TSV forming step and the step of forming interconnects on the back surface.

It is then proposed to bond a semiconductor substrate to a support of silicon or glass, for example, via an adhesive layer. The resulting system is sufficient to withstand the steps of grinding the back surface and forming TSV and electrodes on the back surface. The adhesive layer for bonding the substrate to the support is critical for this system. The adhesive layer must bond the substrate to the support without leaving gaps, be durable enough to withstand the subsequent steps, and eventually allow the thin wafer to be readily released from the support. The adhesive layer is referred herein to as "temporary adhesive layer" or "temporary bonding arrangement" since it is finally removed.

With regard to temporary adhesive layers and removal thereof, Patent Document 1 discloses a layer of an adhesive composition containing a light absorbing agent. Since the adhesive composition may be decomposed by irradiating the adhesive layer with high intensity light, the adhesive layer may be removed from the support. Patent Document 2 discloses a layer of an adhesive composition comprising a heat melting hydrocarbon compound, wherein the layer can be bonded and released in the heat molten condition. The former technology requires an expensive tool such as laser and a longer time of treatment per substrate. The latter technology is simple because of control only by heat, but applicable to a limited range because of poor heat stability at high temperatures in excess of 200° C. These temporary adhesive layers are not adequate to form a layer of uniform thickness on a heavily stepped substrate and to provide a complete bond to the support.

Patent Document 3 discloses the use of a silicone adhesive composition as the temporary bond layer. A substrate is bonded to a support with an addition reaction curable silicone adhesive composition. On removal, the assembly is immersed in an etching solution capable of dissolving or decomposing the silicone resin, whereby the substrate is separated from the support. This method takes a very long time for removal and is applicable to the commercial manufacture process with difficulty.

Also proposed is a temporary adhesive agent which exhibits heat resistance during wafer processing, establishes a satisfactory temporary bond, and enables effective release at normal temperature. With this method, the wafer is released from the support by mechanical peeling via interfacial or cohesive failure of the temporary adhesive agent. Although the wafer and the support can be separated in a relatively simple manner, this method has the risk that the adhesive agent forms particles upon separation, with which the equipment can be contaminated.

Patent Documents 4 and 5 disclose that an antistatic agent is added to adhesives or pressure-sensitive adhesives such as acrylic adhesives and epoxy adhesives to reduce surface resistivity at the adhesive surface. Since the addition of antistatic agent rather adversely affects heat resistance, the resulting adhesive is inadequate as the temporary adhesive in the semiconductor field involving temperature exposure.

CITATION LIST

Patent Document 1: JP-A 2004-064040 (U.S. Pat. No. 8,800,631, EP 1550156)
Patent Document 2: JP-A 2006-328104
Patent Document 3: U.S. Pat. No. 7,541,264
Patent Document 4: JP-A 2014-141649
Patent Document 5: JP-A 2015-041663 (WO 2015/025661)

SUMMARY OF INVENTION

An object of the invention is to provide a wafer processing bonding arrangement which facilitates to establish a temporary bond between a wafer and a support, can be formed to a uniform thickness even on a heavily stepped substrate, is compatible with the TSV forming and back surface interconnect forming steps, has heat resistance, i.e., resistance to wafer heating steps such as CVD, allows for easy separation of the wafer from the support, suppresses generation of contaminant particles upon separation, and increases the productivity of thin wafers. Another object is to provide a wafer laminate wherein a wafer is bonded to a support through the bonding arrangement, and a method for manufacturing a thin wafer.

The inventors have reached a wafer processing bonding arrangement for temporarily bonding a wafer to a support, comprising a silicone-base adhesive composition and an antistatic agent, specifically a composite temporary bonding arrangement comprising a first temporary bond layer (A) of non-silicone thermoplastic resin, and a second temporary bond layer (B) of thermosetting silicone polymer and/or a third temporary bond layer (C) of thermosetting siloxane-modified polymer, wherein preferably layer (B) and/or layer (C) contains the antistatic agent. This bonding arrangement suppresses generation of contaminant particles when the wafer is separated from the support, has heat resistance, facilitates to establish a temporary bond, can be formed to a uniform thickness even on a heavily stepped substrate, is compatible with the TSV forming and back surface interconnect forming steps, has resistance to wafer heating steps such as CVD, allows for easy separation of the wafer from the support, and increases the productivity of thin wafers.

In one aspect, the invention provides a wafer processing bonding arrangement for temporarily bonding a wafer to a support, comprising a silicone-base adhesive composition and an antistatic agent.

Typically, the bonding arrangement comprises a first temporary bond layer (A) of non-silicone thermoplastic resin, and a second temporary bond layer (B) of thermosetting silicone polymer and/or a third temporary bond layer (C) of thermosetting siloxane-modified polymer.

Preferably, the second temporary bond layer (B) and/or third temporary bond layer (C) contains the antistatic agent.

Preferably, the content of the antistatic agent is 0.01 to 10% by weight of the temporary bond layer which contains the antistatic agent.

In another aspect, the invention provides a wafer laminate comprising a wafer and a support wherein the wafer is bonded to the support through a bonding arrangement comprising a silicone-base adhesive layer, the bonding arrangement containing an antistatic agent.

In a preferred embodiment, the wafer laminate includes:
the wafer having a circuit-forming front surface,
the bonding arrangement comprising a first temporary bond layer (A) of non-silicone thermoplastic resin releasably bonded to the front surface of the wafer, and a second temporary bond layer (B) of thermosetting silicone polymer and/or a third temporary bond layer (C) of thermosetting siloxane-modified polymer, which is laid on the first temporary bond layer (A), and
the support releasably laid on the second temporary bond layer (B) or third temporary bond layer (C),
wherein the second temporary bond layer (B) and/or third temporary bond layer (C) contains the antistatic agent.

In a further aspect, the invention provides a method for manufacturing a thin wafer, comprising the steps of temporarily bonding a wafer to a support using the bonding arrangement defined above, processing the wafer to a reduced thickness, and releasing the processed wafer from the support.

ADVANTAGEOUS EFFECTS OF INVENTION

The wafer processing bonding arrangement of the invention is used as a support layer for substrate bonding. Since the bonding arrangement is improved in bonding to another material, is devoid of resin pyrolysis or resin flow at high temperature, and has heat resistance, it is applicable to a wide range of semiconductor film forming process. A temporary adhesive layer of high thickness uniformity can be formed even on a stepped wafer. By virtue of thickness uniformity of the temporary adhesive layer, a uniform thin wafer of up to 50 μm can be readily manufactured. After the wafer is thinned, the wafer can be readily separated from the support at room temperature. Since generation of particles in the separation step is prevented, working efficiency is improved. Fragile thin wafers can be readily manufactured.

BRIEF DESCRIPTION OF DRAWING

FIG. 1 is a cross-sectional view of a wafer laminate in one embodiment of the invention.

DESCRIPTION OF PREFERRED EMBODIMENT

As used herein, the notation (Cn-Cm) means a group containing from n to m carbon atoms per group.

The wafer processing bonding arrangement of the invention is a bond material for temporarily bonding a wafer to a support, comprising a silicone-base adhesive composition and an antistatic agent.

Wafer Processing Bonding Arrangement

The wafer processing bonding arrangement is used to temporarily bond a wafer to a support. The bonding arrangement is not particularly limited as long as it contains a silicone-base adhesive composition and an antistatic agent. The bonding arrangement is preferably constructed as a composite temporary bonding arrangement of two or three-layer structure comprising a first temporary bond layer (A) of non-silicone thermoplastic resin, and a second temporary bond layer (B) of thermosetting silicone polymer and/or a third temporary bond layer (C) of thermosetting siloxane-modified polymer, more preferably a composite temporary bonding arrangement of three-layer structure comprising layers (A), (B) and (C) stacked in order.

Specifically, the wafer processing bonding arrangement is a bonding arrangement for temporarily bonding a wafer having a circuit-forming front surface and a back surface to be processed to a support for wafer processing purpose. The bonding arrangement is preferably constructed as a composite temporary bonding arrangement of two-layer structure comprising a first temporary bond layer (A) of non-silicone thermoplastic resin which is temporarily bonded to the surface of the wafer, and a second temporary bond layer (B) of thermosetting silicone polymer or a third temporary bond layer (C) of thermosetting siloxane-modified polymer which is laid on the first temporary bond layer (A) and releasably bonded to the support, or as a composite temporary bonding arrangement of three-layer structure comprising a first temporary bond layer (A) of non-silicone thermoplastic resin which is temporarily bonded to the surface of the wafer, a second temporary bond layer (B) of thermosetting silicone polymer which is laid on the first temporary bond layer (A), and a third temporary bond layer (C) of thermosetting siloxane-modified polymer which is laid on the second temporary bond layer (B) and releasably bonded to the support, and more preferably a composite temporary bonding arrangement of three-layer structure having layers (A), (B) and (C) stacked in order from the wafer side.

In the composite temporary bonding arrangement, at least one of the bond layers should contain an antistatic agent. Preferably at least one of the second temporary bond layer (B) of thermosetting silicone polymer and the third temporary bond layer (C) of thermosetting siloxane-modified polymer, which are both silicone-base adhesive compositions, contains an antistatic agent.

The temporary bonding arrangement for wafer processing as constructed above facilitates to establish a temporary bond between a wafer and a support, enables to form an adhesive layer of uniform thickness even on a heavily stepped substrate, is compatible with the TSV forming and back surface interconnect forming steps, and resistant to wafer thermal processing like CVD, allows for easy separation, and offers high productivity in the manufacture of thin wafers.

The wafer processing bonding arrangement is constructed as a composite temporary bonding arrangement of two or three-layer structure comprising a first temporary bond layer (A) of non-silicone thermoplastic resin, and a second temporary bond layer (B) of thermosetting silicone polymer and/or a third temporary bond layer (C) of thermosetting siloxane-modified polymer, wherein at least one layer contains an antistatic agent, and more preferably of three-layer structure having layers (A), (B) and (C) stacked in order from the wafer side. Using this bonding arrangement for bonding a wafer to a support, a thin wafer having a TSV structure or bump interconnect structure can be easily manufactured.

In one embodiment of the invention, a wafer laminate is shown in FIG. 1 as comprising a wafer (or device wafer) 1 to be processed, a support 3 for carrying the wafer 1 during its processing, and a composite temporary bonding arrangement 2 intervening between the wafer 1 and the support 3. The wafer 1 has a circuit-forming front surface and a back surface to be processed. The composite temporary bonding arrangement 2 has a three-layer structure consisting of a first temporary bond layer (A) of non-silicone thermoplastic resin, a second temporary bond layer (B) of thermosetting silicone polymer, and a third temporary bond layer (C) of thermosetting siloxane-modified polymer wherein the first temporary bond layer (A) is releasably bonded to the surface of the wafer 1 whereas the third temporary bond layer (C) is releasably bonded to the support 3.

In another embodiment, the wafer laminate includes a composite temporary bonding arrangement of two-layer structure consisting of a first temporary bond layer (A) of non-silicone thermoplastic resin, and a second temporary bond layer (B) of thermosetting silicone polymer or a third temporary bond layer (C) of thermosetting siloxane-modified polymer wherein the first temporary bond layer (A) is releasably bonded to the surface of the wafer whereas the second or third temporary bond layer (B) or (C) is releasably bonded to the support.

Below the composite temporary bonding arrangement of two or three-layer structure is described in detail.

Composite Temporary Bonding Arrangement

First Temporary Bond Layer (A) of Non-Silicone Thermoplastic Resin

The first temporary bond layer (A) is composed of an organopolysiloxane-free thermoplastic resin (non-silicone thermoplastic elastomer). If a polymer having siloxane bonds is used in the first temporary bond layer (A), there is a risk of intermixing with the thermosetting silicone polymer layer (B) or thermosetting siloxane-modified polymer layer (C). From the standpoint of applicability to a stepped silicon wafer, a thermoplastic resin having a satisfactory spin-coating ability is preferably used to form the first temporary bond layer (A). Suitable thermoplastic resins include olefin base thermoplastic elastomers, polybutadiene base thermoplastic elastomers, styrene base thermoplastic elastomers, styrene-butadiene base thermoplastic elastomers, and styrene-polyolefin base thermoplastic elastomers. Inter alia, hydrogenated polystyrene base elastomers are preferred for heat resistance. Molecular weight of the elastomer is preferably about 10,000 to about 500,000.

Such thermoplastic resins are commercially available as Tuftec® (Asahi Kasei Chemicals Corporation), ESPOLEX® SB Series (Sumitomo Chemical Co., Ltd.), RABALON® (Mitsubishi Chemical Corp.), SEPTON® (Kuraray Co., Ltd.), and DYNARON® (JSR Corporation). Also preferred are cycloolefin polymers as typified by ZEONEX® (ZEON Corp.) and cyclic olefin copolymers as typified by TOPAS® (Polyplastics Co., Ltd.).

The first temporary bond layer (A) of such construction allows for easy separation of the wafer from the support at room temperature after thinning, suggesting ease of handling of a fragile thin wafer.

The non-silicone thermoplastic resin layer (A) may be formed by dissolving the thermoplastic resin in a solvent to form a non-silicone thermoplastic resin composition (A') and applying the solution onto a semiconductor substrate, typically silicon wafer by a suitable coating technique such as spin coating or spray coating. In this way, the resin layer (A) can be coated effectively and uniformly. Although the coating thickness is not particularly limited, a resin coating is desirably formed so as to accommodate steps on the substrate. Preferably the resin is coated to a thickness of 0.5 to 50 µm, more preferably 0.5 to 10 µm.

Suitable solvents for dissolving the thermoplastic resin include hydrocarbon solvents such as isooctane, nonane, p-menthane, pinene, and isooctane. Inter alia, nonane, p-menthane and isooctane are preferred for efficient coating.

To the non-silicone thermoplastic resin composition (A'), an antioxidant for improving heat resistance and a surfactant for facilitating coating may be added as long as the benefits of the invention are not impaired. A typical antioxidant is di-t-butylphenol. Suitable surfactants include fluorosilicone surfactants, for example, X-70-1102 (Shin-Etsu Chemical Co., Ltd.).

Second Temporary Bond Layer (B) of Thermosetting Silicone Polymer

The thermosetting silicone polymer layer (B) which constitutes the wafer laminate is not particularly limited as long as it is formed by curing a thermosetting silicone composition. For example, the layer (B) is preferably a cured layer of a thermosetting silicone composition (B') comprising the following components:

(B-1) an organopolysiloxane having at least two alkenyl groups per molecule, (B-2) an organohydrogenpolysiloxane containing at least two silicon-bonded hydrogen atoms (i.e., SiH groups) in such an amount as to give a molar ratio of SiH group in component (B-2) to alkenyl group in component (B-1) of 0.3/1 to 10/1, (B-3) a reaction inhibitor in an amount of 0 to 10 parts, especially 0.1 to 10 parts' by weight per 100 parts by weight of components (B-1) and (B-2) combined, and (B-4) a catalytic amount of a platinum base catalyst.

These components are described below.

Component (B-1)

Component (B-1) is an organopolysiloxane having at least two alkenyl groups per molecule, preferably a linear or branched diorganopolysiloxane having at least two alkenyl groups per molecule, and more preferably a diorganopolysiloxane containing 0.3 to 10 mol % (moles of alkenyl group/moles of Si), especially 0.5 to 9 mol % of alkenyl groups in the molecule.

Component (B-1) typically has a number average molecular weight (Mn) of 1,000 to 1,000,000, preferably 3,000 to 500,000. With too low Mn, the cured coating may be brittle. With too high Mn, coating operation may be adversely affected. It is noted throughout the specification that molecular weight or degree of polymerization is determined as a number average molecular weight (Mn), weight average molecular weight (Mw) or number average degree of polymerization by gel permeation chromatography (GPC) versus polystyrene standards using toluene as developing solvent.

Examples of the diorganopolysiloxane are those of the general formulae (1) and (2).

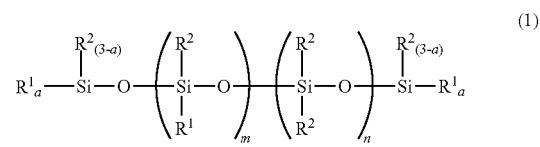

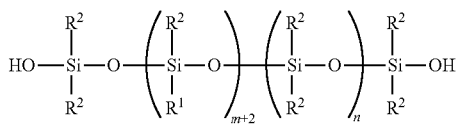

(2)

Herein R¹ is each independently an alkenyl-containing monovalent organic group, R² is each independently a monovalent hydrocarbon group free of aliphatic unsaturation, "a" is an integer of 0 to 3, especially 1 to 3, m is 0 or a positive number of up to 10, and n is a positive number of 1 to 1,000. The value of 2a+m in formula (1) or the value of m+2 in formula (2) is such a number as to give an alkenyl content of 0.3 to 10 mol % in the molecule.

R¹ is preferably an alkenyl-containing monovalent organic group of 2 to 10 carbon atoms, examples of which include alkenyl groups such as vinyl, allyl, hexenyl and octenyl; (meth)acryloylalkyl groups such as acryloylpropyl, acryloyloylmethyl and methacryloylpropyl; (meth)acryloxyalkyl groups such as acryloxypropyl, acryloxymethyl, methacryloxypropyl and methacryloxymethyl; and an alkenyl-containing monovalent hydrocarbon groups such as cyclohexenylethyl and vinyloxypropyl, with vinyl being preferred from the industrial aspect.

R² is preferably a monovalent hydrocarbon group of 1 to carbon atoms, examples of which include alkyl groups such as methyl, ethyl, propyl and butyl, cycloalkyl groups such as cyclohexyl, and aryl groups such as phenyl and tolyl, with alkyl groups such as methyl and phenyl being preferred.

In formula (1). "a" is an integer of 0 to 3. The value of "a" which is 1 to 3 means that the molecular chain is terminated with an alkenyl group. By virtue of the highly reactive alkenyl group at the end of molecular chain, the reaction is advantageously completed in a short time. Industrially, a=1 is most preferred for cost. The alkenyl-containing diorganopolysiloxane is preferably oily or gum-like while it may be linear or branched. Component (B-1) may be used alone or in admixture of two or more.

Component (B-2)

Component (B-2) is an organohydrogenpolysiloxane having at least two silicon-bonded hydrogen atoms (i.e., SiH groups) per molecule, which serves as a crosslinker. The organohydrogenpolysiloxane (B-2) has at least 2, preferably at least 3 SiH groups per molecule while it may be linear, branched or cyclic. SiH groups may be located at the end or an intermediate position of the molecular chain or both.

Preferably the organohydrogenpolysiloxane (B-2) has a viscosity at 25° C. of 1 to 5,000 mPa·s, more preferably 5 to 500 mPa·s, as measured by a rotational viscometer. For the organohydrogenpolysiloxane (B-2), the number of silicon atoms per molecule (i.e., degree of polymerization) is preferably 4 to 1,000, more preferably 10 to 100. Component (B-2) may be used in admixture of two or more.

Component (B-2) is compounded in an amount to give a molar ratio of SiH group in component (B-2) to alkenyl group in component (B-1) (SiH/alkenyl) in a range of 0.3/1 to 10/1, preferably 1/1 to 8/1. When the SiH/alkenyl molar ratio is not less than 0.3, there arise no problems like a lowering of crosslinking density and under-cure of the adhesive layer. When the SiH/alkenyl molar ratio is not more than 10, crosslinking density may not become too high, an appropriate bonding force (or adhesion strength) and tack are available, and the treatment solution may have an extended pot-life.

Component (B-3)

Component (B-3) is a reaction inhibitor which is optionally added to a thermosetting silicone composition. When a thermosetting silicone composition is prepared in solution form and coated onto a substrate, the reaction inhibitor functions to prevent the processing solution from viscosity buildup and gelation prior to heat curing.

Suitable reaction inhibitors include 3-methyl-1-butyn-3-ol, 3-methyl-1-pentyn-3-ol, 3,5-dimethyl-1-hexyn-3-ol, 1-ethynylcyclohexanol, 3-methyl-3-trimethylsiloxy-1-butyne, 3-methyl-3-trimethylsiloxy-1-pentyne, 3,5-dimethyl-3-trimethylsiloxy-1-hexyne, 1-ethynyl-1-trimethylsiloxycyclohexane, bis(2,2-dimethyl-3-butynoxy)dimethylsilane, 1,3,5,7-tetramethyl-1,3,5,7-tetravinylcyclotetrasiloxane, and 1,1,3,3-tetramethyl-1,3-divinyldisiloxane. Inter alia, 3-methyl-1-butyn-3-ol and 1-ethynylcyclohexanol are preferred.

When used, component (B-3) is added in an amount of typically 0.1 to 10 parts, preferably 0.1 to 8 parts, and more preferably 0.05 to 2 parts by weight per 100 parts by weight of components (B-1) and (B-2) combined. Up to 10 parts by weight of component (B-3) keeps the thermosetting silicone composition fully curable whereas at least 0.1 part by weight of component (B-3) may provide a reaction inhibiting effect.

Component (B-4)

Component (B-4) is a platinum group metal-based catalyst, specifically platinum-based catalyst. The catalyst promotes addition reaction between silicon-bonded alkenyl group in component (B-1) and SiH group in component (B-2). Examples of the platinum-based catalyst include chloroplatinic acid, an alcohol solution of chloroplatinic acid, reaction products of chloroplatinic acid with alcohols, reaction products of chloroplatinic acid with olefin compounds, and reaction products of chloroplatinic acid with vinyl-containing siloxanes.

Component (B-4) is added in a catalytic amount, specifically to provide 1 to 5,000 ppm, more preferably 5 to 2,000 ppm of platinum based on the total weight of components (B-1) and (B-2). When at least 1 ppm of platinum is available, the thermosetting silicone composition remains fully curable, and a lowering of crosslinking density and a lowering of retaining force are avoided. When platinum is up to 5,000 ppm, the processing solution has an extended pot-life.

To the thermosetting silicone composition (B'), another organopolysiloxane comprising $R^3{}_3SiO_{0.5}$ units and $SiO_2$ units wherein $R^3$ is each independently a substituted or unsubstituted, $C_1$-$C_{10}$ monovalent hydrocarbon group may be added. The molar ratio of $R^3{}_3SiO_{0.5}$ units to $SiO_2$ units ranges from 0.3/1 to 1.8/1. The other organopolysiloxane is preferably added in an amount of 0 to 30% by weight based on the weight of component (B-1). When used, an amount of 1 to 30% by weight is preferred.

The thermosetting silicone polymer layer (B) may be formed on a support or an uncured thermosetting siloxane-modified polymer layer (C) on a support by applying the thermosetting silicone composition (B') by a suitable technique such as spin coating or roll coating. When the thermosetting silicone composition (B') is applied onto the uncured thermosetting siloxane-modified polymer layer (C) by a suitable technique such as spin coating, a solution of the thermosetting silicone composition (B') is preferably prepared prior to coating. To this end, solvents may be used. Typically hydrocarbon solvents such as pentane, hexane, cyclohexane, isooctane, nonane, decane, p-menthane, pinene, isododecane and limonene are preferably used. To the thermosetting silicone composition (B'), any well-known antioxidant may be added for improving heat resistance. To the thermosetting silicone composition (B'), a filler such as silica may be added for further enhancing heat resistance. Specifically up to 50 parts by weight of the filler may be added per 100 parts by weight of component (B-1).

The thermosetting silicone composition (B') is preferably used so as to form a coating having a thickness of 0.1 to 30 μm. As long as the coating thickness is 0.1 μm or more, it is able to cover the entire surface of the uncured thermosetting siloxane-modified polymer layer (C) without leaving uncoated spots. As long as the coating thickness is 30 μm or less, it can withstand the grinding step in the manufacture of a thin wafer.

The thermosetting silicone polymer layer (B) is typically such that in a 180° peel test on a polyimide test piece of 25 mm wide having a thermosetting silicone polymer layer (B) coated thereon, the force required to peel layer (B) from the polyimide base at an angle of 180° is 2 gf to 50 gf, preferably 3 gf to 30 gf, and more preferably 5 gf to 20 gf. The thermosetting silicone polymer layer (B) having a peeling force of at least 2 gf prevents a wafer from being moved aside during wafer grinding whereas the layer having a peeling force of up to 50 gf allows easy separation of a wafer. The thermosetting silicone polymer layer (B) preferably has a thickness of 0.1 to 30 μm, more preferably 1 to 20 μm.

Third Temporary Bond Layer (C) of Thermosetting Siloxane-Modified Polymer

The third temporary bond layer (C) which constitutes the wafer laminate is formed of a thermosetting siloxane-modified polymer. The layer (C) is not particularly limited as long as it is formed by curing a thermosetting siloxane-containing composition. Preferably layer (C) is formed by curing a thermosetting siloxane-containing composition (C') composed mainly of a thermosetting siloxane-modified polymer having the general formula (3) or (4).

Phenolic Siloxane Polymer of Formula (3)

In one embodiment, the thermosetting siloxane-modified polymer is a phenolic siloxane polymer comprising recurring units of the general formula (3) and having a Mw of 3,000 to 500,000.

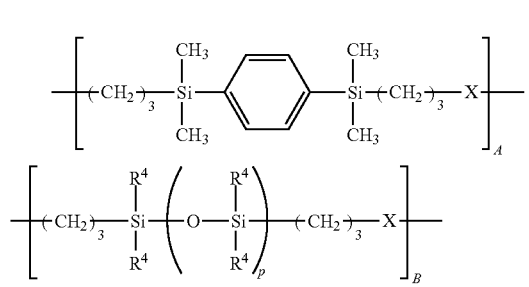

(3)

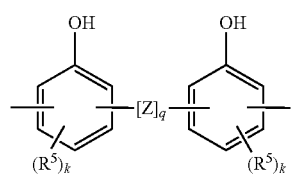

(a)

Herein Z is a divalent organic group selected from the following:

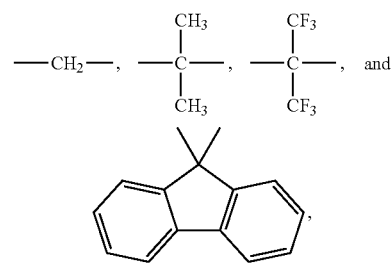

q is 0 or 1, $R^5$ is each independently an alkyl or alkoxy group of 1 to 4 carbon atoms, and k is 0, 1 or 2.

Suitable groups of $R^4$ include methyl, ethyl and phenyl. The subscript p is preferably an integer of 3 to 60, more preferably 8 to 40. B and A are preferably such numbers as to give a ratio B/A of 0/1 to 20/1, more preferably 0.5/1 to 5/1. Suitable groups of $R^5$ include methyl, ethyl, propyl, methoxy and ethoxy.

Epoxy-Modified Siloxane Polymer of Formula (4)

In another embodiment, the thermosetting siloxane-modified polymer is an epoxy-modified siloxane polymer comprising recurring units of the general formula (4) and having a Mw of 3,000 to 500,000.

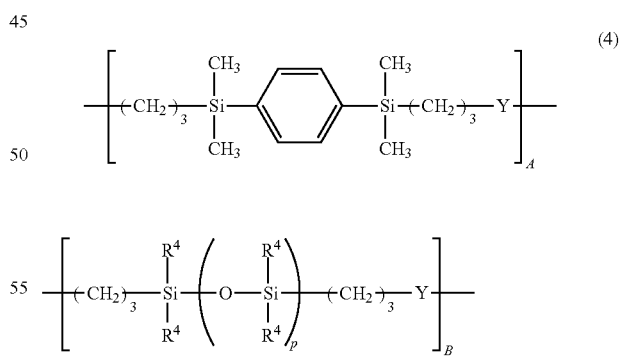

(4)

Herein $R^4$ is each independently a monovalent hydrocarbon group of 1 to 8 carbon atoms, typically alkyl, p is an integer of 1 to 100, A is 0 or a positive number, B is a positive number, and A+B=1. Preferably A is 0 to 0.9, and B is 0.1 to 1. When A is more than 0, A is preferably 0.1 to 0.7 and B is preferably 0.3 to 0.9. X is a divalent organic group having the general formula (a).

Herein $R^4$ is each independently a monovalent hydrocarbon group of 1 to 8 carbon atoms, typically alkyl, p is an integer of 1 to 100, A is 0 or a positive number, B is a positive number, and A+B=1. Preferably A is 0 to 0.9, and B is 0.1 to 1. When A is more than 0, A is preferably 0.1 to 0.7 and B is preferably 0.3 to 0.9. Y is a divalent organic group having the general formula (b).

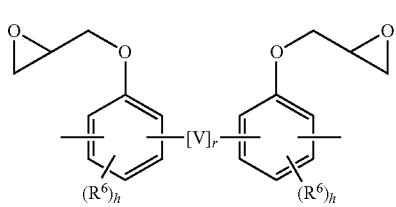

Herein V is a divalent organic group selected from the following:

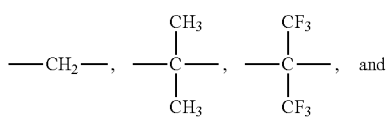

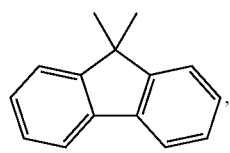

r is 0 or 1, $R^6$ is each independently an alkyl or alkoxy group of 1 to 4 carbon atoms, and h is 0, 1 or 2.

Exemplary groups of $R^4$ and suitable values of p are as described above for formula (3). Suitable groups of $R^6$ are as exemplified above for $R^5$.

The thermosetting siloxane-containing composition (C') composed mainly of the thermosetting siloxane-modified polymer of formula (3) and/or (4) defined above contains a crosslinker for the thermosetting purpose. For the phenolic siloxane polymer of formula (3), the crosslinker is at least one member selected from among an amino condensate, melamine resin and urea resin modified with formaldehyde or formaldehyde-alcohol, a phenol compound having on average at least two phenol, methylol or alkoxymethylol groups per molecule, and an epoxy compound having on average at least two epoxy groups per molecule. For the epoxy-modified siloxane polymer of formula (4), the crosslinker is at least one member selected from among an epoxy compound having on average at least two epoxy groups per molecule and a phenol compound having on average at least two phenol groups per molecule.

Preferred epoxy compounds having multi-functional epoxy groups for use in the thermosetting siloxane-containing compositions (C') composed mainly of the thermosetting siloxane-modified polymers of formulae (3) and (4) include, but are not limited to, multi-functional epoxy resins having a functionality of 2, 3, 4 or more, for example, those resins commercially available under the trade name of EOCN-1020, EOCN-102S, XD-1000, NC-2000-L, EPPN-201, GAN and NC6000 from Nippon Kayaku Co., Ltd. Crosslinkers of the following formulae are also useful.

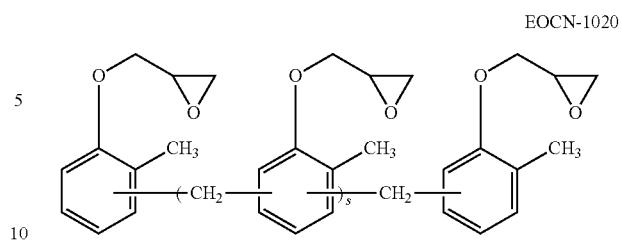

EOCN-1020

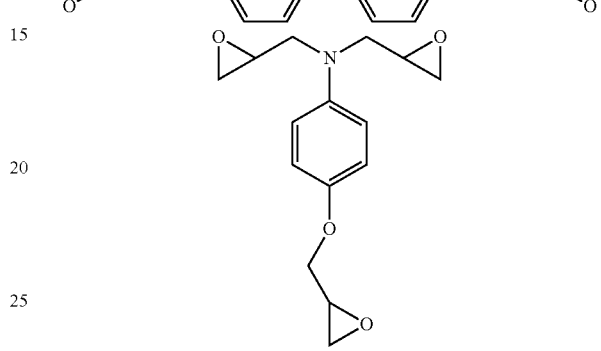

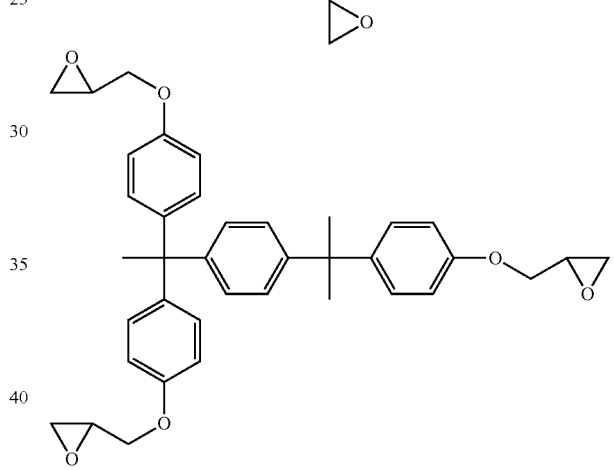

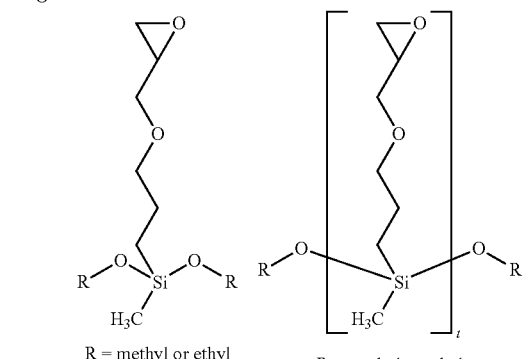

R = methyl or ethyl

R = methyl or ethyl
t = 1 20 wt %
t = 2 75 wt %
t ≥ 3 5 wt %

Suitable crosslinkers for use with the epoxy-modified siloxane polymer of formula (4) serving as the thermosetting siloxane-modified polymer include m and p-cresol novolak resins, e.g., EP-6030G from Asahi Organic Chemicals Industry Co., Ltd., trifunctional phenol compounds, e.g., Tris-P-PA from Honshu Chemical Industry Co., Ltd., and tetrafunctional phenol compounds, e.g., TEP-TPA from Asahi Organic Chemicals Industry Co., Ltd.

The crosslinker is added in an amount of 0.1 to 50 parts, preferably 0.1 to 30 parts, and more preferably 1 to 20 parts by weight per 100 parts by weight of the thermosetting siloxane-modified polymer. More than one crosslinker may be added.

The thermosetting siloxane-containing composition (C') is preferably a composition comprising 100 parts by weight of a phenolic siloxane polymer comprising recurring units of formula (3) and having a Mw of 3,000 to 500,000 and 0.1 to 50 parts by weight of a crosslinker which is selected from among an amino condensate, melamine resin and urea resin modified with formaldehyde or formaldehyde-alcohol, a phenol compound having on average at least two phenol, methylol or alkoxymethylol groups per molecule, and an epoxy compound having on average at least two epoxy groups per molecule; or a composition comprising 100 parts by weight of an epoxy-modified siloxane polymer comprising recurring units of formula (4) and having a Mw of 3,000 to 500,000 and 0.1 to 50 parts by weight of a crosslinker which is selected from among a phenol compound having on average at least two phenol groups per molecule and an epoxy compound having on average at least two epoxy groups per molecule.

To the thermosetting siloxane-containing composition (C'), a curing catalyst such as acid anhydride may be added in an amount of up to 10 parts by weight per 100 parts by weight of the thermosetting siloxane-modified polymer.

The thermosetting siloxane-containing composition (C') may further contain a solvent. Examples of the solvent used herein include ketones such as cyclohexanone, cyclopentanone and methyl-2-n-amylketone, alcohols such as 3-methoxybutanol, 3-methyl-3-methoxybutanol, 1-methoxy-2-propanol and 1-ethoxy-2-propanol, ethers such as propylene glycol monomethyl ether, ethylene glycol monomethyl ether, propylene glycol monoethyl ether, ethylene glycol monoethyl ether, propylene glycol dimethyl ether and diethylene glycol dimethyl ether, and esters such as propylene glycol monomethyl ether acetate (PGMEA), propylene glycol monoethyl ether acetate, ethyl lactate, ethyl pyruvate, butyl acetate, methyl 3-methoxypropionate, ethyl 3-ethoxypropionate, t-butyl acetate, t-butyl propionate, propylene glycol mono-t-butyl ether acetate and γ-butyrolactone, which may be used alone or in admixture.

Notably, any well-known antioxidants and fillers such as silica may be added to the thermosetting siloxane-containing composition (C') in an amount of up to 50 parts by weight per 100 parts by weight of the thermosetting siloxane-modified polymer for further enhancing heat resistance. Also a surfactant may be added for improving coating uniformity.

The thermosetting siloxane-containing composition (C') may be applied to a support by a suitable coating technique such as spin coating, roll coating or die coating. The thermosetting siloxane-containing composition (C') is preferably deposited such that the cured thickness is in the range of 15 to 150 μm, more preferably 20 to 120 μm, depending on steps on the wafer. When the layer thickness is at least 15 μm, it can withstand the grinding step for the thinning of a wafer. When the layer thickness is up to 150 μm, it is practically acceptable because the risk of resin deformation during the heat treatment step such as TSV forming step is eliminated.

Antistatic Agent

The antistatic agent used herein may be selected from well-known anionic surfactants, cationic surfactants, nonionic surfactants, ampholytic surfactants, and electroconductive polymers. These agents may be used alone or in admixture of two or more.

Suitable anionic surfactants include carboxylic acid salts, sulfonic acid salts, sulfuric acid salts and phosphoric acid salts, examples of which include alkaline metal or alkali earth metal salts such as alkyl ether carboxylic acid salts, aliphatic amide ether carboxylic acid salts, acyllactic acid salts, N-acylglutamic acid salts, N-acylmethylalanine salts, N-acylsarcosine salts, N-acyl-ω-amino acid salts, alkanesulfonic acid salts, α-olefinsulfonic acid salts, α-sulfofatty acid methyl ester salts, acylisethionic acid salts, alkylsulfosuccinic acid salts, alkylsulfoacetic acid salt, alkylbenzene sulfonic acid salt, alkylnaphthalene sulfonic acid salt, N-acylmethyl taurine salt, salts of sulfuric acid formalin condensate, alkylsulfuric acid salts, alkyl ether sulfuric acid salts, alkyl aryl ether sulfuric acid salts, fatty acid alkanolamide sulfuric acid salts, fatty acid monoglyceride sulfuric acid salts, alkylphosphoric acid salts, polyoxyethylene alkyl ether phosphoric acid salts, alkyl aryl ether phosphoric acid salts and aliphatic amide ether phosphoric acid salts.

Suitable cationic surfactants include primary amine salts, secondary amine salts, tertiary amine salts, fatty acid amidoamine salts, quaternary ammonium salts, alkyl trialkylene glycol ammonium salts, alkyl ether ammonium salts, benzalkonium salts, benzethonium salts, pyridinium salts and imidazolinium salt.

Suitable nonionic surfactants include esters of 5 to 25 carbon atoms such as propylene glycol mono-fatty acid ester, ethylene glycol mono-fatty acid ester, glycerin mono-fatty acid ester, polyglycerin fatty acid ester, sorbitan fatty acid ester, sucrose fatty acid ester, methylglycoside fatty acid ester, alkyl polyglycoside, polyoxyethylene mono-fatty acid ester, polyoxyethylene glycerin fatty acid ester, polyoxyethylene sorbitan fatty acid ester, polyoxyethylene sorbitol fatty acid ester; ethers of 5 to 25 carbon atoms such as polyoxyethylene alkyl ether, polyoxyethylene alkylphenyl ether, polyoxyethylene cholesterol, polyoxyethylene cholestanol, polyoxyethylene polyoxypropylene alkyl ether and polyoxyethylene polyoxypropylene glycol; and amides such as polyoxyethylene fatty acid amide, alkyl diethanolamide and alkylamine oxide.

Suitable ampholytic surfactants include aminopropionic acid, and carboxybetaine and sulfobetaine of 5 to 20 carbon atoms.

Suitable electroconductive polymers include polythiophene, poly pyrrole, polyacetylene and polyaniline.

It is noted that although fluorochemical surfactants are generally used in adhesive compositions, they fail to eliminate the problem of particles being left on the semiconductor wafer, i.e., to improve anti-contamination. The antistatic agent is preferably selected from nonionic and ampholytic surfactants, especially such surfactants having a SP value of 6 to 12.

The use of the antistatic agent includes, for example, coating onto the surface of silicone-base adhesive layer and previous addition to silicone-base adhesive, with the pre-addition to silicone-base adhesive being preferred. For the composite laminate including a plurality of adhesive layers, the antistatic agent is preferably incorporated in at least one silicone-base adhesive layer. Alternatively, the antistatic agent may be incorporated in an adhesive layer other than the silicone-base adhesive layer. In the composite bonding arrangement defined above, the antistatic agent is preferably incorporated in at least the second bond layer (B) and/or third bond layer (C).

When the antistatic agent is coated onto the surface of a silicone-base adhesive layer, the antistatic agent may be dissolved in a solvent to form a coating solution, which may be applied to the adhesive layer surface by any suitable technique, for example, brush coating, spray coating, spin coating, bar coating, or roll coating.

The antistatic agent is incorporated in a sufficient amount to exert an antistatic effect, preferably 0.01 to 10% by weight, more preferably 0.1 to 5% by weight of the entire bonding arrangement. Particularly when the antistatic agent is incorporated in a certain layer, for example, the second temporary bond layer (B), that layer should preferably contain 0.01 to 10%, more preferably 0.1 to 5% by weight of the antistatic agent. When the antistatic agent is incorporated in the third temporary bond layer (C), that layer should preferably contain 0.01 to 10%, more preferably 0.1 to 5% by weight of the antistatic agent. When the antistatic agent is incorporated in the second and third temporary bond layers (B) and (C), the total content of the antistatic agent in these layers should preferably be controlled to a range of 0.01 to 10%, more preferably 0.1 to 5% by weight. Less than 0.01 wt % of the antistatic agent may be insufficient to provide anti-contamination, dimensional stability and heat resistance whereas more than 10 wt % of the antistatic agent may adversely affect adhesion and wafer processing.

Thin Wafer Manufacturing Method

A further embodiment of the invention is a method for manufacturing a thin wafer, which is characterized in that a composite temporary bonding arrangement comprising a non-silicone thermoplastic resin layer (A), and a thermosetting silicone polymer layer (B) and/or a thermosetting siloxane-modified polymer layer (C) as defined above is used as a bond layer between a wafer (having a semiconductor circuit formed therein) and a support. The thin wafer manufactured by the method typically has a thickness of 5 to 300 µm, more typically 10 to 100 µm.

The preferred method for manufacturing a thin wafer involves the steps of:

(a) bonding a wafer to a support via a composite temporary bonding arrangement, the wafer having a circuit-forming front surface and a non-circuit-forming back surface, with the circuit-forming surface facing the support, the composite temporary bonding arrangement comprising a non-silicone thermoplastic resin layer (A), and a thermosetting silicone polymer layer (B) and/or a thermosetting siloxane-modified polymer layer (C), step (a) including coating non-silicone thermoplastic resin composition (A') and then forming non-silicone thermoplastic resin layer (A), forming a layer of thermosetting silicone composition (B') or a layer of thermosetting siloxane-containing composition (C') on the support, or a layer of thermosetting silicone composition (B') on a layer of thermosetting siloxane-containing composition (C') preformed on the support, and bonding the support having a layer of composition (C') and/or (B') formed thereon to the circuit-bearing wafer having a non-silicone thermoplastic resin layer (A) formed thereon in vacuum or reduced pressure such that the resin layers may be mated with each other, (b) heat curing the layer of thermosetting siloxane-containing composition (C') and/or the layer of thermosetting silicone composition (B'), (c) grinding or polishing the non-circuit-forming surface of the wafer bonded to the support, (d) processing the non-circuit-forming surface of the wafer, and (e) separating the processed wafer from the support.

In an alternative embodiment, step (a) includes bonding the support having a layer of thermosetting siloxane-containing composition (C') formed thereon to the circuit-bearing wafer having a non-silicone thermoplastic resin layer (A) and a layer of thermosetting silicone composition (B') formed thereon in vacuum or reduced pressure such that the resin layers may be mated with each other.

Since the thin wafer manufacturing method uses the composite temporary bonding arrangement consisting of two or three layers to bond the wafer to the support prior to processing and separating steps, a thin wafer having a TSV structure or bump connect structure can be readily manufactured. This method permits the support to be bonded to the wafer and readily separated from the processed wafer, and facilitates the subsequent dicing step. A strain-free thin wafer can be manufactured without substantial failure.

The method for manufacturing a thin wafer from a starting wafer involves steps (a) to (e). The starting wafer has a circuit-forming front surface and a non-circuit-forming back surface.

Step (a)

Step (a) is for bonding the starting wafer to a support via a composite temporary bonding arrangement in vacuum or reduced pressure, with the circuit-forming surface of the wafer facing the support, the composite temporary bonding arrangement comprising a non-silicone thermoplastic resin layer (A), and a thermosetting silicone polymer layer (B) and/or a thermosetting siloxane-modified polymer layer (C). Step (a) includes forming a non-silicone thermoplastic resin layer (A) of non-silicone thermoplastic resin composition (A') on the circuit-forming surface of the wafer, and forming a layer of thermosetting silicone composition (B') or a layer of thermosetting siloxane-containing composition (C') on one surface of the support, or in the case of three layer structure, forming a layer of thermosetting silicone composition (B') on a layer of thermosetting siloxane-containing composition (C') preformed on the support, and then bonding the non-silicone thermoplastic resin layer (A) on the wafer to the layer of thermosetting silicone composition (B') on the support, the layer of thermosetting siloxane-containing composition (C') on the support, or the layer of thermosetting silicone composition (B') on the layer of thermosetting siloxane-containing composition (C') in vacuum or reduced pressure. Preferably adhesive layers are formed on a substrate in the order of layers (A), (B) and (C).

In an alternative embodiment, step (a) includes forming a non-silicone thermoplastic resin layer (A) of non-silicone thermoplastic resin composition (A') on the circuit-forming surface of the wafer, forming a layer of thermosetting silicone composition (B') thereon, forming a layer of thermosetting siloxane-containing composition (C') on one surface of the support, and then bonding the layer of thermosetting silicone composition (B') on the non-silicone thermoplastic resin layer (A) on the wafer to the layer of thermosetting siloxane-containing composition (C') on the support in vacuum.

The wafer has a pair of opposed surfaces, that is, a front surface where a semiconductor circuit is formed and a back surface where a semiconductor circuit is not formed. The wafer which can be used herein is typically a semiconductor wafer. Suitable semiconductor wafers include silicon wafers, germanium wafers, gallium-arsenic wafers, gallium-phosphorus wafers, and gallium-arsenic-aluminum wafers. Although the thickness of the wafer is not particularly limited, it is typically 600 to 800 µm, more typically 625 to 775 µm.

The support which can be used herein may be selected from substrates such as silicon wafers, glass plates, and quartz wafers, though not limited thereto. In the practice of the invention, the support need not be light transmissive because there is no need to irradiate energy radiation to the temporary adhesive layer through the support.

The non-silicone thermoplastic composition (A'), composition (B') and composition (C') may be pre-formed as films, which may be attached to the wafer or the support. Alternatively, the composition (A'), (B') or (C') in a solvent may be uniformly applied to the wafer or the support by a suitable coating technique such as spin coating. After spin coating, prebake is performed at a temperature of 80 to 200° C., preferably 100 to 180° C., depending on the volatility of a particular solvent used. The resulting coated product is ready for use.

The wafer and support having layers of compositions (A'), (B') and (C') formed thereon are joined together via the layers into a wafer laminate (also referred to as bonded substrate). The assembly is uniformly compressed preferably at a temperature of 40 to 200° C., more preferably 60 to 180° C. in vacuum or reduced pressure for 10 to 300 seconds, yielding a wafer laminate of wafer bonded to support (or laminate substrate). The vacuum condition may be a reduced pressure, preferably a pressure of 0.01 to 500 Pa, more preferably 0.01 to 100 Pa. The compression is preferably conducted at 0.1 to 50 kN.

The wafer bonding system used herein includes commercially available wafer bonders such as EVG520IS and 850TB from EV Group, and XBC300 from SUSS MicroTec AG.

Step (b)

Step (b) is to thermally cure the layer of thermosetting silicone composition (B') and/or the layer of thermosetting siloxane-containing composition (C'). After the wafer laminate (or laminate substrate) is formed, the thermosetting silicone composition (B') and the thermosetting siloxane-containing composition (C') are cured into a thermoplastic siloxane resin polymer layer (B) and a thermosetting siloxane-modified polymer layer (C) by heating at 120 to 220° C., preferably 150 to 200° C. for 10 minutes to 4 hours, preferably 30 minutes to 2 hours.

Step (c)

Following is step (c) of grinding or polishing the non-circuit-forming surface of the wafer bonded to the support. Step (c) is intended to reduce the thickness of the wafer by grinding or polishing the wafer back surface of the wafer laminate resulting from step (a). The technique of grinding the wafer back surface is not particularly limited, and any well-known grinding techniques may be used. The wafer is preferably ground by a grinding wheel (e.g., diamond grinding wheel), while feeding water to the wafer and the wheel for cooling. As the means for grinding the wafer back surface, for example, a surface grinder DAG-810 by DISCO Co., Ltd. may be used. The wafer back surface may also be subjected to chemical mechanical polishing (CMP).

Step (d)

Step (d) is to process the non-circuit-forming surface of the wafer laminate which has been ground, i.e., the non-circuit-forming surface of the wafer which has been thinned by back surface grinding step (c). This step includes various processes which can be applied on the wafer level, for example, electrode formation, metal conductor formation, and protective film formation. More specifically, any conventional well-known processes may be applied, including metal sputtering for forming electrodes or the like, wet etching of a sputtered metal layer, formation of a pattern (serving as a mask for metal conductor formation) by resist coating, exposure and development, removal of resist, dry etching, metallization, silicon etching for TSV formation, and oxide film formation on silicon surface.

Step (e)

Step (e) is to release the wafer which has been processed in step (d) from the wafer laminate, that is, separating the thin wafer from the wafer laminate after processing in step (d) and before dicing. This release procedure is typically performed at a relatively low temperature from room temperature to about 60° C. Suitable release procedures for separating the wafer from the support include, but are not limited to, a pull-up procedure of holding the wafer or support of the wafer laminate horizontally, and pulling up the support or wafer at an angle relative to the horizon, and a peeling procedure of attaching a protective film to the ground surface of the wafer and peeling the protective film together with the wafer from the wafer laminate.

Either of these procedures may be used in the release step (e). Although the release procedure is not particularly limited, preference is given to the above-described release procedures. The release procedure is typically performed at room temperature.

Preferably step (e) of releasing the processed wafer from the support includes the steps of (f) attaching a dicing tape to the processed surface of the wafer, (g) vacuum chucking the dicing tape to a chuck platen, and (h) separating the support from the processed wafer in a peel-off manner while keeping the temperature of the chuck platen in a range of 10 to 100° C. In this way, the support carrying the bonding arrangement may be readily separated from the processed wafer, and the subsequent dicing step may be readily performed.

Preferably step (e) of releasing the processed wafer from the support carrying the bonding arrangement is followed by step (i) of removing any temporary bond layer remaining on the circuit-forming surface of the wafer. Sometimes, the non-silicone thermoplastic resin layer (A) is partially left on the circuit-forming surface of the wafer which has been released from the support in step (e). The non-silicone thermoplastic resin layer (A) may be removed, for example, by washing the wafer.

Step (i) may use any cleaning fluid which is capable of dissolving the thermoplastic resin of which the non-silicone thermoplastic resin layer (A) is made. Suitable solvents include pentane, hexane, cyclohexane, decane, isononane, p-menthane, pinene, isododecane, and limonene, which may be used alone or in admixture. If removal is difficult, a base or acid may be added to the solvent. Suitable bases include amines such as ethanolamine, diethanolamine, triethanolamine, triethylamine and ammonia, and ammonium salts such as tetramethylammonium hydroxide. Suitable acids include organic acids such as acetic acid, oxalic acid, benzenesulfonic acid, and dodecylbenzenesulfonic acid. The base or acid is typically added in such amounts as to give a concentration of 0.01 to 10% by weight, preferably 0.1 to 5% by weight in the cleaning fluid. For more efficient removal of residues, any known surfactants may be added to the cleaning fluid.

The washing step may be carried out by agitating the fluid with a puddle, spraying the fluid or immersing in a cleaning fluid bath. The temperature is preferably 10 to 80° C., more preferably 15 to 65° C. The dissolution of non-silicone thermoplastic resin layer (A) in the cleaning fluid may be followed by water or alcohol rinsing and drying, yielding a thin wafer.

EXAMPLE

Examples of the invention are given below by way of illustration and not by way of limitation. All parts are by weight. Weight average molecular weight (Mw) and number average molecular weight (Mn) are measured by gel permeation chromatography (GPC) versus polystyrene standards.

Resin Synthesis Example 1

A flask equipped with a stirrer, thermometer, nitrogen purge line and reflux condenser was charged with 43.1 g of 9,9'-bis(3-allyl-4-hydroxyphenyl)fluorene (M-1), 29.5 g of organohydrogensiloxane having the average structural formula (M-3), 135 g of toluene, and 0.04 g of chloroplatinic acid and heated at 80° C. Then, 17.5 g of 1,4-bis(dimethylsilyl)benzene (M-5) was added dropwise to the flask over one hour while the flask internal temperature rose to 85° C. At the end of dropwise addition, the reaction solution was aged at 80° C. for 2 hours. Toluene was distilled off, and instead, 80 g of cyclohexanone was added, obtaining a resin solution in cyclohexanone having a resin solid concentration of 50 wt %. The molecular weight of the resin in the solution was determined by GPC, finding a Mw of 45,000. To 50 g of the resin solution were added 7.5 g of an epoxy compound (EOCN-1020 by Nippon Kayaku Co., Ltd.) as crosslinker, 0.2 g of bis(t-butylsulfonyl)diazomethane (BSDM by Wako Pure Chemical Industries, Ltd.) as curing catalyst, and 0.1 g of tetrakis[methylene-(3,5-di-t-butyl-4-hydroxyhydrocinnamate)]-methane (ADK STAB AO-60) as antioxidant. Filtration through a membrane filter with a pore size of 1 µm yielded a thermosetting siloxane-containing composition solution (C-1).

Resin Synthesis Example 2

In a 5-L flask equipped with a stirrer, thermometer, nitrogen purge line and reflux condenser, 84.1 g of epoxy compound (M-2) was dissolved in 600 g of toluene. Then 294.6 g of compound (M-3) and 25.5 g of compound (M-4) were added to the flask, which was heated at 60° C. Then 1 g of platinum-on-carbon catalyst (5 wt %) was added. It was seen that the internal temperature rose to 65-67° C. Thereafter, the flask was further heated at 90° C., held at the temperature for 3 hours for ripening, and cooled to room temperature. To the reaction solution was added 600 g of methyl isobutyl ketone (MIBK). The reaction solution was passed through a filter under pressure to remove the platinum catalyst. Once the solvent was distilled off in vacuum from the resin solution, 270 g of propylene glycol monomethyl ether acetate (PGMEA) was added to the residue to form a resin solution in PGMEA having a resin solid concentration of 60 wt %. The molecular weight of the resin in the solution was determined by GPC, finding a Mw of 28,000. To 100 g of the resin solution were added 9 g of tetrafunctional phenol compound (TEP-TPA by Asahi Organic Chemical Industry Co., Ltd.) as crosslinker and 0.2 g of tetrahydrophthalic anhydride (Rikacid HH-A by New Japan Chemical Co., Ltd.) as curing catalyst. Filtration through a membrane filter with a pore size of 1 µm yielded a thermosetting siloxane-containing composition solution (C-2).

Resin Synthesis Example 3

In a 5-L flask equipped with a stirrer, thermometer, nitrogen purge line and reflux condenser, 10.8 g of 9,9'-bis (3-allyl-4-hydroxyphenyl)fluorene (M-1) and 21.0 g of epoxy compound (M-2) were dissolved in 900 g of toluene. 325.9 g of compound (M-6) and 25.5 g of compound (M-4) were added to the solution, which was heated at 60° C. Then 1 g of platinum-on-carbon catalyst (5 wt %) was added. It was seen that the internal temperature rose to 65-67° C. Thereafter, the flask was further heated at 90° C., held at the temperature for 3 hours for ripening, and cooled to room temperature. To the reaction solution was added 600 g of MIBK. The reaction solution was passed through a filter under pressure to remove the platinum catalyst. Once the solvent was distilled off in vacuum from the resin solution, 240 g of PGMEA was added to the residue to form a resin solution in PGMEA having a solid concentration of 60 wt %. The molecular weight of the resin in the solution was determined by GPC, finding a Mw of 35,000. To 100 g of the resin solution were added 5 g of tetrafunctional phenol compound (TEP-TPA by Asahi Organic Chemical Industry Co., Ltd.) and 0.2 g of tetrahydrophthalic anhydride (Rikacid HH-A by New Japan Chemical Co., Ltd.). Filtration through a membrane filter with a pore size of 1 µm yielded a thermosetting siloxane-containing composition solution (C-3).

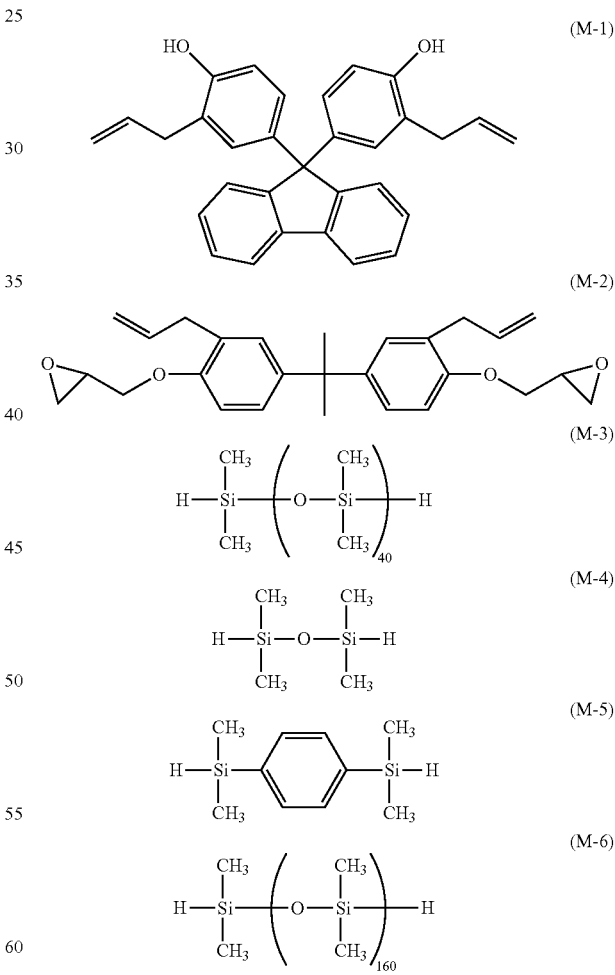

Resin Solution Preparation Example 1

24 g of a hydrogenated styrene-butadiene copolymer with MW of 30,000 as thermoplastic resin was dissolved in 176 g of isononane to form a 12 wt % isononane solution of styrene-butadiene copolymer. The solution was filtered through a membrane filter with a pore size of 0.2 μm, obtaining an isononane solution of non-silicone thermoplastic resin or organopolysiloxane-free thermoplastic resin (A-1).

Resin Solution Preparation Example 2

To a solution of 80 parts of polydimethylsiloxane containing 0.5 mol % of vinyl as pendant and having a Mn of 30,000 in 400 parts of isododecane, 3.0 parts of organohydrogenpolysiloxane (M-7) and 0.7 part of ethynylcyclohexanol were added and mixed. A molar ratio of SiH/SiVi was 1.1. To the solution was added 0.5 part of platinum catalyst (CAT-PL-5, Shin-Etsu Chemical Co., Ltd.). The solution was filtered through a membrane filter with a pore size of 0.2 μm, obtaining a thermosetting silicone composition solution (B-1). 2 parts of Nissananon® BL (lauryldimethylaminoacetic acid betaine, NOF Corp.) as antistatic agent was added to 100 parts of the thermosetting silicone composition solution (B-1), yielding an antistatic agent-loaded thermosetting silicone composition solution (B-1A).

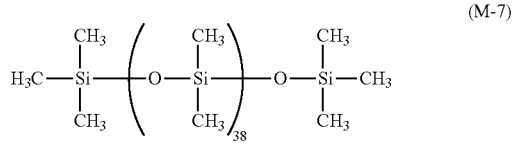

(M-7)

Resin Solution Preparation Example 3

To a solution of 60 parts of polydimethylsiloxane containing 0.5 mol % of vinyl as pendant and having a Mn of 30,000 and 20 parts of polydimethylsiloxane containing 0.15 mol % of vinyl at both ends of the molecular chain and having a Mn of 60,000 in 400 parts of isododecane, 2.5 parts of organohydrogenpolysiloxane (M-7) and 0.7 part of ethynylcyclohexanol were added and mixed. A molar ratio of SiH/SiVi was 1.2. To the solution was added 0.5 part of platinum catalyst (CAT-PL-5, Shin-Etsu Chemical Co., Ltd.). The solution was filtered through a membrane filter with a pore size of 0.2 μm, obtaining a thermosetting silicone composition solution (B-2). 3 parts of Nonion S-207 (polyoxyethylene stearyl ether, NOF Corp.) as antistatic agent was added to 100 parts of the thermosetting silicone composition solution (B-2), yielding an antistatic agent-loaded thermosetting silicone composition solution (B-2A).

Resin Solution Preparation Example 4

3 parts of Nissananon® BL (NOF Corp.) as antistatic agent was added to 100 parts as solids of the thermosetting siloxane-containing composition solution (C-1) in Resin Synthesis Example 1, yielding an antistatic agent-loaded thermosetting siloxane-containing composition solution (C-1A).

Resin Solution Preparation Example 5

4 parts of Plonon #202B (ethylene glycol-propylene glycol-ethylene glycol block copolymer, NOF Corp.) as antistatic agent was added to 100 parts as solids of the thermosetting siloxane-containing composition solution (C-2) in Resin Synthesis Example 2, yielding an antistatic agent-loaded thermosetting siloxane-containing composition solution (C-2A).

Resin Solution Preparation Example 6

3 parts of Nissananon® BL (NOF Corp.) as antistatic agent was added to 100 parts as solids of the resin solution (C-3) in Resin Synthesis Example 3, yielding an antistatic agent-loaded resin solution (C-3A).

Resin Solution Preparation Example 7

A four-necked flask equipped with an impeller, thermometer, nitrogen purge line, condenser and dropping funnel was charged with 400 parts of MEK, 30 parts of 2-(acryloyloxy) ethyltrimethylammonium bis(trifluoromethanesulfonyl)imide, 60 parts of methyl methacrylate, and 10 parts of 2-hydroxyethyl methacrylate. In nitrogen atmosphere, the contents were stirred at 80° C. for 1 hour, to which 0.2 part of 2,2'-azobisisobutyronitrile (AIBN) as polymerization initiator was added, allowing reaction to run at 80° C. for 6 hours. Then, 0.1 part of AIBN was admitted to the reaction solution, allowing reaction to run at 80° C. for 1 hour. Thereafter, 0.2 part of AIBN was admitted to the reaction solution at 70° C., allowing reaction to run for 4 hours. Further the reaction run at 80° C. for 4 hours, yielding a polymer solution. Finally, 2 parts of Nissananon® BL (NOF Corp.) as antistatic agent was added to 100 parts as solids of the polymer solution, yielding a polymer solution (D).

Resin Solution Preparation Example 8
(Epoxy+Antistatic Agent)

To 100 parts of epoxy resin (EOCN1020 by Nippon Kayaku Co., Ltd.), 80 parts of crosslinker (TEP-TPA by Asahi Organic Chemicals Industry Co., Ltd.), 1 part of cure accelerator (2PHZ-PW by Shikoku Chemicals Corp.), and 180 parts of cyclopentanone were added to form a solution having a solid content of 50 wt %. 2 parts of Nissananon® BL (NOF Corp.) as antistatic agent was added to 100 parts as solids of the solution. Filtration through a membrane filter with a pore size of 0.2 μm yielded a resin solution (E).

Measurement Examples 1 to 12

Measurement of Resin Properties

Each resin solution in Tables 1 and 2 was spin coated onto a silicon wafer with a diameter of 200 mm and a thickness of 725 μm and baked on a hot plate at 150° C. for 5 minutes to form a resin layer having the thickness shown in Tables 1 and 2. With respect to the resin-coated wafer, the resin layer was evaluated for resistivity as an index of electrical charging, with the results shown in Tables 1 and 2. The electrical charge test was according to JIS K6911 (double ring electrode method).

TABLE 1

| | Measurement Example | | | | | | | |
|---|---|---|---|---|---|---|---|---|
| | 1 | 2 | 3 | 4 | 5 | 6 | 7 | 8 |
| Resin layer | B-1A | B-2A | C-1A | C-2A | B-1 | B-2 | C-1 | C-2 |
| Resin layer thickness (μm) | 10 | 10 | 60 | 60 | 10 | 10 | 60 | 60 |
| Surface resistivity (Ω) | $2 \times 10^{10}$ | $9 \times 10^{9}$ | $3 \times 10^{10}$ | $5 \times 10^{9}$ | $1 \times 10^{16}<$ | $1 \times 10^{16}<$ | $1 \times 10^{16}<$ | $1 \times 10^{16}<$ |

TABLE 2

| | Measurement Example | | | |
|---|---|---|---|---|
| | 9 | 10 | 11 | 12 |
| Resin layer | D | E | C-3 | C-3A |
| Resin layer thickness (μm) | 10 | 10 | 60 | 60 |
| Surface resistivity (Ω) | $8 \times 10^{9}$ | $8 \times 10^{9}$ | $1 \times 10^{16}<$ | $7 \times 10^{9}$ |

Examples 1 to 7 and Comparative Examples 1 to 4

The wafer used herein was a silicon wafer (diameter 200 mm, thickness 725 μm) having copper posts (diameter 40 μm, height 10 μm) distributed over its entire surface. Non-silicone thermoplastic resin solution (A-1) corresponding to layer (A) was spin coated to the silicon wafer and heated on a hot plate at 150° C. for 5 minutes to form a layer (A) having a thickness shown in Table 3 on the bump-bearing surface of the wafer. Thereafter, thermosetting silicone composition solution (B-1), (B-2), (B-1A) or (B-2A) corresponding to layer (B) was spin coated onto the layer (A) on the wafer and heated on a hot plate at 150° C. for 3 minutes to form a layer (B') having a thickness shown in Table 3.

The support used herein was a glass plate (diameter 200 mm, thickness 500 μm). Thermosetting siloxane-containing composition solution (C-1), (C-2), (C-1A), (C-2A) or (C-3A) corresponding to layer (C) was spin coated to the support and heated on a hot plate at 150° C. for 5 minutes to form a layer (C') having a thickness shown in Table 3 on the glass support.

Using a vacuum wafer bonder (EVG520IS by EV Group), the silicon wafer having non-silicone thermoplastic resin layer (A) and layer (B') of thermosetting silicone composition on layer (A) was joined to the glass plate having layer (C') of thermosetting siloxane-containing composition, with their resin layers (i.e., layers (B') and (C')) mated together, under a vacuum of less than $10^{-3}$ mbar and at a bonding temperature shown in Table 3. There was obtained a wafer laminate having the wafer bonded to the support via the bonding arrangement (resin layers). The laminate was heated in an oven at 190° C. for 1 hour to cure layers (B') and (C'), obtaining a laminate sample.

In Example 7, a laminate sample was prepared and cured as in Example 1 except that layer (B) was omitted. In Comparative Examples 3 and 4, laminate samples were prepared and cured as in Example 1 except that layer (C) was omitted, layer (B) instead of layer (C) was formed on a glass support using solution (D) or (E), and the silicon wafer having layer (A) was joined to the glass plate having layer (B), with their resin layers (i.e., layers (A) and (B)) mated together.

It is noted that although a glass plate is used herein as the support so that the laminate may be visually inspected for defects, a silicon wafer or substrate which is not transmissive to light may also be used.

Each wafer laminate sample was examined by the following tests. The results of Examples and Comparative Examples are shown in Table 3. The tests other than dimensional stability and antistatic tests were carried out in sequence. If a sample failed in a certain test (i.e., was judged "X"), the subsequent test was no longer performed.

Antistatic Test

The bonding arrangement (resin layers) in the wafer laminate was measured for surface resistivity at 23° C. by the double ring electrode method of JIS K6911. The sample was evaluated poor (X) when the resistivity was $\geq 10^{13} \Omega$, good (○) when the resistivity was $\leq 10^{12} \Omega$, and excellent (◎) when the resistivity was $\leq 10^{9} \Omega$.

Adhesion Test

The interfacial bond state between resin layers in the bonding arrangement, that is, between layers (B') and (C') in Examples 1 to 6 and Comparative Examples 1, 2, between layers (A) and (C') in Example 7, or between layers (A) and (B') in Comparative Examples 3, 4 was visually observed. The sample was evaluated good (○) when no defectives like bubbles were found at the interface, and poor (X) when defectives were found.

Back Surface Grinding Test

The back surface of the silicon wafer of the laminate was ground by a grinder (DAG810 by DISCO Co., Ltd.) having a diamond abrasive wheel. After the wafer was ground to a final thickness of 50 μm, it was observed for defectives such as cracks and dislodgment under an optical microscope (100×). The sample was evaluated good (○) when no defectives were found, and poor (X) when defectives were found.

CVD Resistance Test

After the silicon wafer had been ground, the wafer laminate was placed in a CVD apparatus where a $SiO_2$ film was deposited to a thickness of 2 μm. The outer appearance of the laminate was observed for anomaly under electron microscope. The sample was evaluated good (○) when no appearance anomalies were found, and poor (X) when appearance anomalies such as void formation, wafer bulging and wafer rupture were found. CVD resistance test was performed under the following conditions.

Apparatus: Plasma CVD PD-270STL (SAMCO, Inc.) RF 500W, Inner pressure 40 Pa,
TEOS (tetraethyl orthosilicate): $O_2$=20:680 sccm Particle Count After the wafer was thinned to 50 μm and separated from the support, the thin wafer at two areas of 1 cm×1 cm, a central area and an edge area, was observed under a laser microscopy. In each area, the number of particles with a size of 1 μm or more was counted. The sample was evaluated good (○) when the total count was 100 or less, and poor (X) when the total count exceeded 100.

Peel Test

The wafer release ability was evaluated. Following the heat resistance test, a dicing tape was applied to the surface of the wafer which had been thinned to 50 μm, using a dicing frame. The dicing tape was set to the chuck platen by vacuum chucking. At room temperature, the glass plate and bonding arrangement was peeled by pulling it up at one point using a pair of tweezers. The sample was evaluated good (○) when the glass plate was peeled without breakage of the 50-μm wafer, and poor (X) when fissure or other anomalies occurred in the wafer.

Clean-Up Test

After the peel test, the 200-mm wafer (which had been exposed to the heat resistance test conditions) mounted on the dicing frame via the dicing tape was set on a spin coater, with the bond layer upside. Over the wafer, p-menthane as cleaning fluid was sprayed for 5 minutes. Rinsing was then performed by spraying isopropyl alcohol (IPA) while spinning the wafer. The outer appearance of the wafer was visually observed for any residual adhesive resin. The sample was evaluated good (○) in the absence of residual resin and poor (X) in the presence of residual resin.

Overall Rating

The sample was rated good (○) when all the test results were good and poor (X) when one or more test results were poor.

TABLE 3

|  | Example | | | | | | | Comparative Example | | | |
|---|---|---|---|---|---|---|---|---|---|---|---|
|  | 1 | 2 | 3 | 4 | 5 | 6 | 7 | 1 | 2 | 3 | 4 |
| Resin layer (A') | A-1 | A-1 | A-1 | A-1 | A-1 | A-1 | A-1 | A-1 | A-1 | A-1 | A-1 |
| Layer (A) thickness (μm) | 5 | 5 | 5 | 5 | 5 | 5 | 5 | 5 | 5 | 5 | 5 |
| Resin layer (B') | B-1A | B-2A | B-1A | B-2A | B-1A | B-1A | — | B-2 | B-2 | D | E |
| Layer (B') thickness (μm) | 5 | 10 | 10 | 5 | 10 | 10 | — | 15 | 2 | 10 | 10 |
| Resin layer (C') | C-1A | C-2A | C-1 | C-2 | C-1A | C-3A | C-1A | C-1 | C-2 | — | — |
| Layer (C') thickness (μm) | 60 | 60 | 60 | 60 | 60 | 60 | 60 | 60 | 60 | — | — |
| Bonding temperature (° C.) | 120 | 120 | 120 | 120 | 120 | 120 | 120 | 120 | 120 | 120 | 120 |
| Bonding time (sec) | 60 | 60 | 60 | 60 | 60 | 60 | 60 | 60 | 60 | 60 | 60 |
| Adhesion | ○ | ○ | ○ | ○ | ○ | ○ | ○ | ○ | ○ | ○ | ○ |
| Resistance to back surface grinding | ○ | ○ | ○ | ○ | ○ | ○ | ○ | ○ | ○ | ○ | ○ |
| CVD resistance | ○ | ○ | ○ | ○ | ○ | ○ | ○ | ○ | ○ | X | X |
| Peel test | ○ | ○ | ○ | ○ | ○ | ○ | ○ | ○ | ○ | ○ | ○ |
| Particle count | ○ | ○ | ○ | ○ | ○ | ○ | ○ | X | X | X | X |
| Clean-up test | ○ | ○ | ○ | ○ | ○ | ○ | ○ | ○ | ○ | ○ | ○ |
| Antistatic test | ⊚ | ⊚ | ⊚ | ⊚ | ⊚ | ⊚ | ○ | X | X | ○ | ○ |
| Overall rating | ○ | ○ | ○ | ○ | ○ | ○ | ○ | X | X | X | X |

Japanese Patent Application No. 2015-160812 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

The invention claimed is:

1. A wafer processing bonding arrangement for temporarily bonding a wafer to a support, comprising a silicone-base adhesive composition and an antistatic agent,
    wherein the silicone-base adhesive composition comprises a first temporary bond layer (A) of non-silicone thermoplastic resin, and a second temporary bond layer (B) of thermosetting silicone polymer and/or a third temporary bond layer (C) of thermosetting siloxane-modified polymer, which is laid on the first temporary bond layer (A),
    wherein the second temporary bond layer (B) and/or third temporary bond layer (C) contains the antistatic agent.

2. The bonding arrangement of claim 1 wherein the content of the antistatic agent is 0.01 to 10% by weight of the temporary bond layer which contains the antistatic agent.

3. A method for manufacturing a thin wafer, comprising the steps of:
    temporarily bonding a wafer to a support using the bonding arrangement of claim 1,
    processing the water to a reduced thickness, and
    releasing the processed wafer from the support.

4. The bonding arrangement of claim 1, comprising a first temporary bond layer (A) of non-silicone thermoplastic resin, and a second temporary bond layer (B) of thermosetting silicone polymer.

5. The bonding arrangement of claim 1, comprising a first temporary bond layer (A) of non-silicone thermoplastic resin, and a third temporary bond layer (C) of thermosetting siloxane-modified polymer.

6. The bonding arrangement of claim 1, comprising a first temporary bond layer (A) of non-silicone thermoplastic resin, a second temporary bond layer (B) of thermosetting silicone polymer, and a third temporary bond layer (C) of thermosetting siloxane-modified polymer.

7. The bonding arrangement of claim 1 wherein the antistatic agent is an anionic surfactant, cationic surfactant, nonionic surfactant, ampholytic surfactant, or electroconductive polymer.

8. A wafer laminate comprising a wafer and a support wherein the wafer is bonded to the support through a bonding arrangement comprising a silicone-base adhesive layer, the bonding arrangement containing an antistatic agent,
    wherein the wafer has a circuit-forming front surface,
    wherein the bonding arrangement comprises a first temporary bond layer (A) of non-silicone thermoplastic resin releasably bonded to the front surface of the wafer, and a second temporary bond layer (B) of thermosetting silicone polymer and/or a third temporary bond layer (C) of thermosetting siloxane-modified polymer, which is laid on the first temporary bond layer (A), and the support is releasably laid on the second temporary bond layer (B) or third temporary bond layer (C), and wherein the second temporary bond layer (B) and/or third temporary bond layer (C) contains the antistatic agent.

9. The wafer laminate of claim 8 wherein the bonding arrangement comprises a first temporary bond layer (A) of non-silicone thermoplastic resin, and a second temporary bond layer (B) of thermosetting silicone polymer.

10. The wafer laminate of claim 8 wherein the bonding arrangement comprises a first temporary bond layer (A) of non-silicone thermoplastic resin, and a third temporary bond layer (C) of thermosetting siloxane-modified polymer.

11. The wafer laminate of claim 8 wherein the bonding arrangement comprises a first temporary bond layer (A) of non-silicone thermoplastic resin, a second temporary bond layer (B) of thermosetting silicone polymer, and a third temporary bond layer (C) of thermosetting siloxane-modified polymer.

12. The wafer laminate of claim 8 wherein the antistatic agent is an anionic surfactant, cationic surfactant, nonionic surfactant, ampholytic surfactant, or electroconductive polymer.

* * * * *